United States Patent
Suzuki et al.

(10) Patent No.: US 7,635,016 B2
(45) Date of Patent: Dec. 22, 2009

(54) BOARD CLEANING METHOD, BOARD CLEANING APPARATUS, AND COMPONENT MOUNTING METHOD

(75) Inventors: Naoki Suzuki, Neyagawa (JP); Youichi Nakamura, Osaka (JP); Kazuyuki Tomita, Ikoma (JP)

(73) Assignee: Panasonic Corporation, Osaka (JP)

( * ) Notice: Subject to any disclaimer, the term of this patent is extended or adjusted under 35 U.S.C. 154(b) by 389 days.

(21) Appl. No.: 10/265,381

(22) Filed: Oct. 7, 2002

(65) Prior Publication Data

US 2006/0118133 A1 Jun. 8, 2006

(30) Foreign Application Priority Data

Oct. 9, 2001 (JP) .............................. 2001-310912

(51) Int. Cl.
*B29C 65/00* (2006.01)
(52) U.S. Cl. ................. 156/535; 156/379.6; 156/379.8; 156/381; 156/497; 156/538; 438/115; 438/719; 438/906; 134/1.1; 134/1.2
(58) Field of Classification Search ................. 134/1.1, 134/1, 2, 3, 32, 30, 1.2; 156/345.31, 345.41, 156/345.43, 345.48, 345.54, 379.6, 379.8, 156/381, 497, 535, 538; 216/67; 438/115, 438/710, 906
See application file for complete search history.

(56) References Cited

U.S. PATENT DOCUMENTS

| | | | | |
|---|---|---|---|---|
| 4,496,420 A | * | 1/1985 | Frohlich et al. ................ 216/17 |
| 4,654,115 A | * | 3/1987 | Egitto et al. .................. 134/1.1 |
| 4,787,957 A | * | 11/1988 | Barkanic et al. ............... 216/67 |
| 4,840,702 A | * | 6/1989 | Schumacher, III ........... 216/17 |
| 5,000,819 A | * | 3/1991 | Pedder et al. .................. 216/69 |
| 5,693,147 A | | 12/1997 | Ward et al. |
| 5,722,581 A | * | 3/1998 | Sindzingre et al. .......... 228/206 |
| 5,830,782 A | * | 11/1998 | Smith et al. .................. 438/123 |
| 5,882,423 A | | 3/1999 | Linn et al. |
| 5,941,448 A | * | 8/1999 | Sindzingre et al. .......... 228/206 |
| 6,468,833 B2 | * | 10/2002 | Uner et al. ................... 438/115 |
| 6,551,860 B2 | * | 4/2003 | Uner et al. ................... 438/115 |
| 6,576,500 B2 | * | 6/2003 | Furukawa et al. ............ 438/127 |
| 2002/0034840 A1 | * | 3/2002 | Furukawa et al. ............ 438/127 |

FOREIGN PATENT DOCUMENTS

| | | |
|---|---|---|
| JP | 05-226457 | 9/1993 |
| JP | 06-260463 | 9/1994 |
| JP | 09-307219 | 11/1997 |

* cited by examiner

*Primary Examiner*—Alexander Markoff
(74) *Attorney, Agent, or Firm*—Wenderoth, Lind & Ponack, L.L.P.

(57) ABSTRACT

In a board cleaning method for dry cleaning of connection sites on resin-based boards, one or more gases selected from a group consisting of gas that contains a hydrogen element and gas that contains a fluorine element are supplied at least to the connection sites, plasma is generated from the supplied gas, and the boards are cleaned by radicals and ions that are produced by the generated plasma.

4 Claims, 6 Drawing Sheets

BOARD CLEANING METHOD, BOARD CLEANING APPARATUS, AND COMPONENT MOUNTING METHOD

BACKGROUND OF THE INVENTION

The present invention relates to a board cleaning method and a board cleaning apparatus for dry cleaning of connection sites on resin-based boards, and a component mounting method for placing electronic components onto these cleaned resin-based boards. Herein, "component mounting method" refers to a method for performing board cleaning and performing placement of electronic components onto cleaned boards. Additionally, "component mounting apparatus or system" refers to an apparatus or a system for performing board cleaning and performing placement of electronic components onto cleaned boards.

With miniaturization of portable telephones, PDA and the like, in recent years, flexible printed circuit boards (which will be referred to as "FPC" (Flexible Printed Circuit), hereinbelow) have been used for internal electric circuits, and direct placement of IC (Integrated Circuit) bare chips (which will be referred to as "IC chips," hereinbelow) onto FPC has been performed.

Electrodes of IC chips are formed with extremely narrow pitches, and adhesive material containing conductive minute particles is used in placement of such IC chips. More specifically, the adhesive material is applied onto an FPC, IC chips are placed thereon, and heat is applied thereto while the IC chips are pressed against the FPC. This operation crushes the conductive minute particles in the adhesive material between the IC chips and the FPC, and makes electric connections between the electrodes of the IC chips and wiring on the FPC. The adhesive material is cured by application of heat.

With increase in degree of integration of circuits in IC chips, pitches of electrodes formed on IC chips have been being narrowed further. Accordingly, pitches of wiring lines that are formed on FPC are required to be further miniaturized. Such miniaturization of the pitches of the wiring lines causes issues such as deterioration and short circuit in the wiring that are caused by ionic migration. Ionic migration refers to deterioration in wiring that is caused by repetitive action of ionization and deposition of wiring metal by moisture absorption. It is known that ionic migration is promoted by chloride residue produced in a plating process in production of FPC.

As pitches of wiring lines have been narrowed, on the other hand, it has been becoming impossible to neglect influences of deposition on wiring of minute organic matter such as skin, scurf, and cosmetics from a human body, or flux, oil, and resin pieces floating in a factory.

Therefore, the present invention has been devised in view of these issues, and an object of the present invention is to provide a board cleaning method, a board cleaning apparatus, and a component mounting method that are capable of improving reliability of connection with resin-based boards and, in particular, an object of the present invention is to provide a board cleaning method, a board cleaning apparatus, and a component mounting method that are capable of achieving improvement in strength of connection by activation of a board surface, suppression of occurrence of ionic migration in wiring formed on boards, and the like.

SUMMARY OF THE INVENTION

In order to achieve the objects, the present invention is configured as follows.

According to a first aspect of the present invention, there is provided a board cleaning method for dry cleaning of connection sites on resin-based boards in a chamber, comprising:

supplying one or more gases, selected from a group consisting of gas that contains a hydrogen element and gas that contains a fluorine element, at least to the connection sites in the chamber; and generating plasma from this supplied gas, and cleaning the boards in the chamber by radicals and ions that are produced by this generated plasma.

According to a second aspect of the present invention, there is provided a board cleaning method as defined in the first aspect, wherein in place of the gas, one or more gases selected from a group consisting of water vapor, alcohol vapor, and fluorocarbonic gas are supplied at least to the connection sites in the chamber, plasma is generated from this supplied gas, and the boards are cleaned in the chamber by radicals and ions that are produced by the generated plasma.

According to a third aspect of the present invention, there is provided a board cleaning method as defined in the first or second aspect, wherein the connection sites are sites on which wiring patterns are formed.

According to a fourth aspect of the present invention, there is provided a board cleaning method as defined in the third aspect, wherein gaps between wiring lines in the wiring patterns are larger than 0 μm and not larger than 25 μm.

According to a fifth aspect of the present invention, there is provided a board cleaning method as defined in the first or second aspect, wherein in cleaning of the boards by radicals and ions that are produced by the plasma, chlorine that is contained in chlorinated solvent used in manufacture of the boards, and that remains on the boards, is removed as gaseous compounds.

According to a sixth aspect of the present invention, there is provided a board cleaning method as defined in the first or second aspect, wherein a pressure of the gas in the chamber is set between 5 and 80 Pa.

According to a seventh aspect of the present invention, there is provided a board cleaning method as defined in the sixth aspect, wherein the pressure of the gas in the chamber is set between 20 and 40 Pa.

According to an eighth aspect of the present invention, there is provided a board cleaning method as defined in the first or second aspect, wherein the gas contains oxygen gas.

According to a ninth aspect of the present invention, there is provided a board cleaning method as defined in the first or second aspect, wherein the boards are conveyed under a nitrogen gas atmosphere after generation of the plasma.

According to a tenth aspect of the present invention, there is provided a board cleaning apparatus for performing dry cleaning of connection sites on resin-based boards, comprising:

a chamber into which the boards are brought;

a gas introducing device for supplying into the chamber one or more gases selected from a group consisting of gas that contains a hydrogen element and gas that contains a fluorine element; and a plasma generating device for generating plasma in the chamber supplied with the gas, in which the boards are cleaned in the chamber by radicals and ions that are produced by the plasma generated in the chamber.

According to an eleventh aspect of the present invention, there is provided a board cleaning apparatus for performing dry cleaning of connection sites on resin-based boards, comprising:

a chamber into which the boards are brought;

a gas introducing device for supplying into the chamber one or more gases selected from a group consisting of water vapor, alcohol vapor, and fluorocarbonic gas; and a plasma generating device for generating plasma in the chamber supplied with the gas, in which the boards are cleaned in the chamber by radicals and ions that are produced by the plasma generated in the chamber.

According to a twelfth aspect of the present invention, there is provided a board cleaning apparatus as defined in the tenth or eleventh aspect, further comprising:

a cover for covering a conveying path through which the boards are carried out of the chamber; and a nitrogen gas supply device for supplying nitrogen gas into the cover.

According to a thirteenth aspect of the present invention, there is provided a component mounting method for placing electronic components onto resin-based boards, comprising:

cleaning connection sites by the board cleaning method as defined in the first or second aspect; and placing the electronic components onto these cleaned connection sites.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
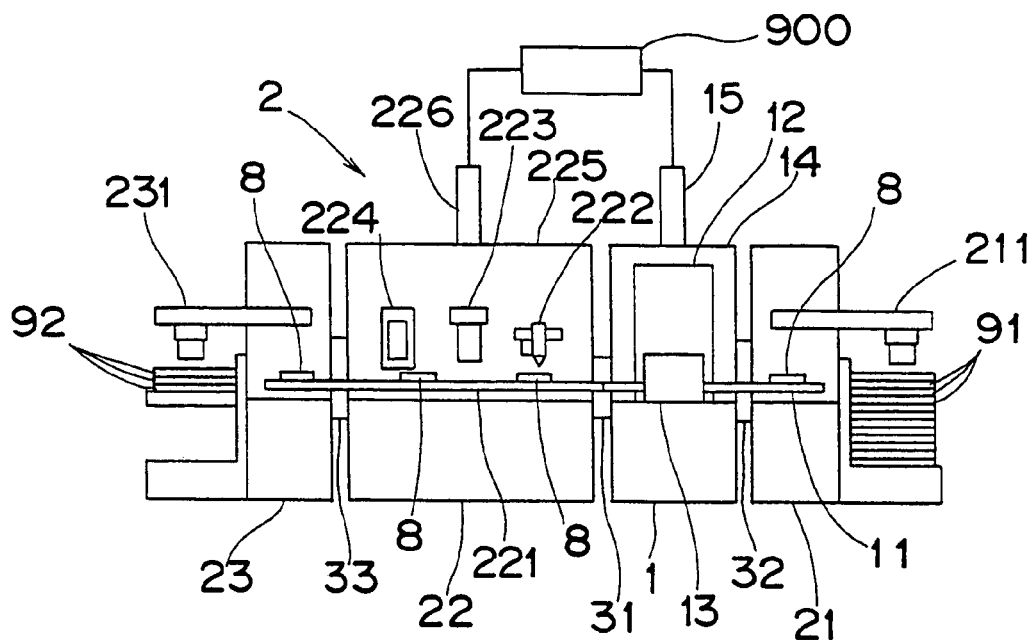
FIG. 1 is a diagram illustrating a component mounting system that has a board cleaning apparatus, in accordance with an embodiment of the present invention.

Before description of the present invention proceeds, it is to be noted that like parts are designated by like reference numerals throughout the accompanying drawings.

Hereinbelow, an embodiment of the present invention will be described in detail with reference to the drawings.

FIG. 1 is a diagram illustrating a component mounting system (i.e., a board mounting apparatus) 2 that has a board cleaning apparatus 1 in accordance with the embodiment of the present invention. The component mounting system 2 has a configuration in which a loader 21 for picking up flexible printed circuit boards (that will be referred to as "boards," hereinbelow) from a tray 91 and loading the boards onto a pallet 8, the board cleaning apparatus 1 for dry cleaning of the boards 9 with the pallet 8 in a chamber, a component placing apparatus 22 for placing IC chips onto the boards 9, and an unloader 23 for picking up boards 9 finished with placement from the pallet 8 and storing the boards on a tray 92 are arranged in order of mention.

The loader 21 has a mechanism for positioning a plurality of trays 91 sequentially at a top position, and a transfer robot 211 thereof loads onto the pallet 8 boards that have been housed on a tray 91. The pallet 8 is separately fed to be positioned on a conveyor 11 that projects from the cleaning apparatus 1, and two boards are loaded on one pallet 8.

The cleaning apparatus 1 has a chamber 12 into which boards are brought together with a pallet 8 and in which dry cleaning of the boards is performed, and a transfer robot 13 for transferring into the chamber 12 the pallet 8 that has been conveyed on the conveyor 11. An upper portion of the cleaning apparatus 1 is covered with a cover 14, and a gas supply pipe 15 that is connected to a nitrogen gas supply device 900 to supply nitrogen gas is connected to the cover 14.

The component placing apparatus 22 has a conveyor 221 for receiving the pallet 8 from the conveyor 11 of the cleaning apparatus 1 and conveying the pallet 8 and has an application section 222 for applying adhesive material that contains conductive minute particles onto the boards that are conveyed on the conveyor 221, a placing section 223 for placing IC chips on this applied adhesive material, and a heating section 224 for pressing the IC chips against the boards while applying heat, which sections are arranged in order of mention. Pressing performed by the heating section 224 crushes the conductive minute particles contained in the adhesive material between electrodes of the IC chips and wiring on the boards, and thus makes electric connections between the IC chips and the wiring, and application of heat cures the adhesive material and fixes the IC chips on the boards.

An upper portion of the component placing apparatus 22 is covered with a cover 225, and a gas supply pipe 226 that is connected to the nitrogen gas supply device 900 to supply nitrogen gas is connected to the cover 225.

Like the loader 21, the unloader 23 has a mechanism for positioning a plurality of trays 92 sequentially at a top position, and a transfer robot 231 thereof picks up boards finished with placement, from the pallet 8 on the conveyor 221 extending into the unloader 23, and transfers the boards onto a tray 92. The pallet 8 is removed from on the conveyor 221 by a mechanism not shown.

In the component mounting system 2, a duct 31 makes a connection between the cover 14 of the cleaning apparatus 1 and the cover 225 of the component placing apparatus 22, and internal air isolation mechanisms 32, 33 (such as an air curtain) that make use of nitrogen gas flow are installed between the loader 21 and the cleaning apparatus 1 and between the component placing apparatus 22 and the unloader 23. This arrangement provides a nitrogen gas atmosphere inside the cover 14 and inside the cover 225.

Figure 2:
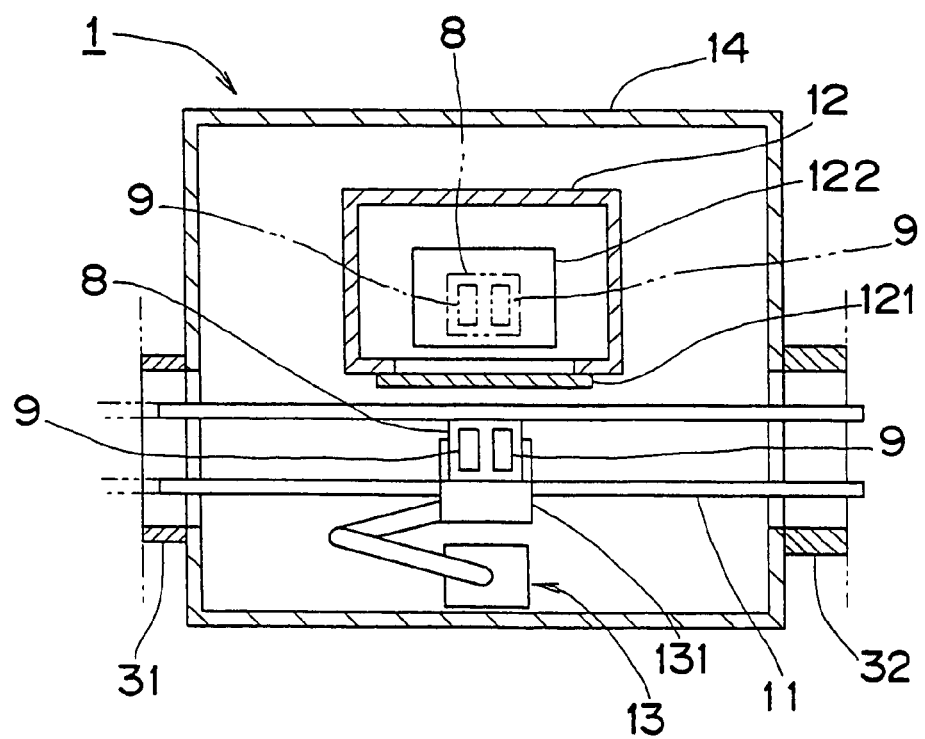
FIG. 2 is a plan view illustrating a configuration of the board cleaning apparatus.

FIG. 2 is a plan view illustrating a configuration of the cleaning apparatus 1. The pallet 8 that is conveyed on the conveyor 11 while holding boards 9 is held by a chuck 131 of the transfer robot 13, is lifted up slightly, and is thereafter carried toward the chamber 12. A gate member 121 is provided in an inlet-outlet port of the chamber 12 so as to be capable of opening and closing the inlet-outlet port by drive of an air cylinder, and the pallet 8 is loaded on a stage 122 in the chamber 12 after the gate member 121 is moved. The stage 122 is insulated by an insulating member 150 from the chamber 12 that is grounded.

After that, the inlet-outlet port is closed by the gate member 121, and dry cleaning of the boards 9 under reduced pressure is performed with use of plasma in the chamber 12. Upon completion of this cleaning, the gate member 121 moves to open the inlet-outlet port, and the chuck 131 removes the boards 9 with the pallet 8 to return the pallet 8 onto the conveyor 11. The pallet 8 is conveyed to the component placing apparatus 22 by the conveyor 11.

Figure 3:
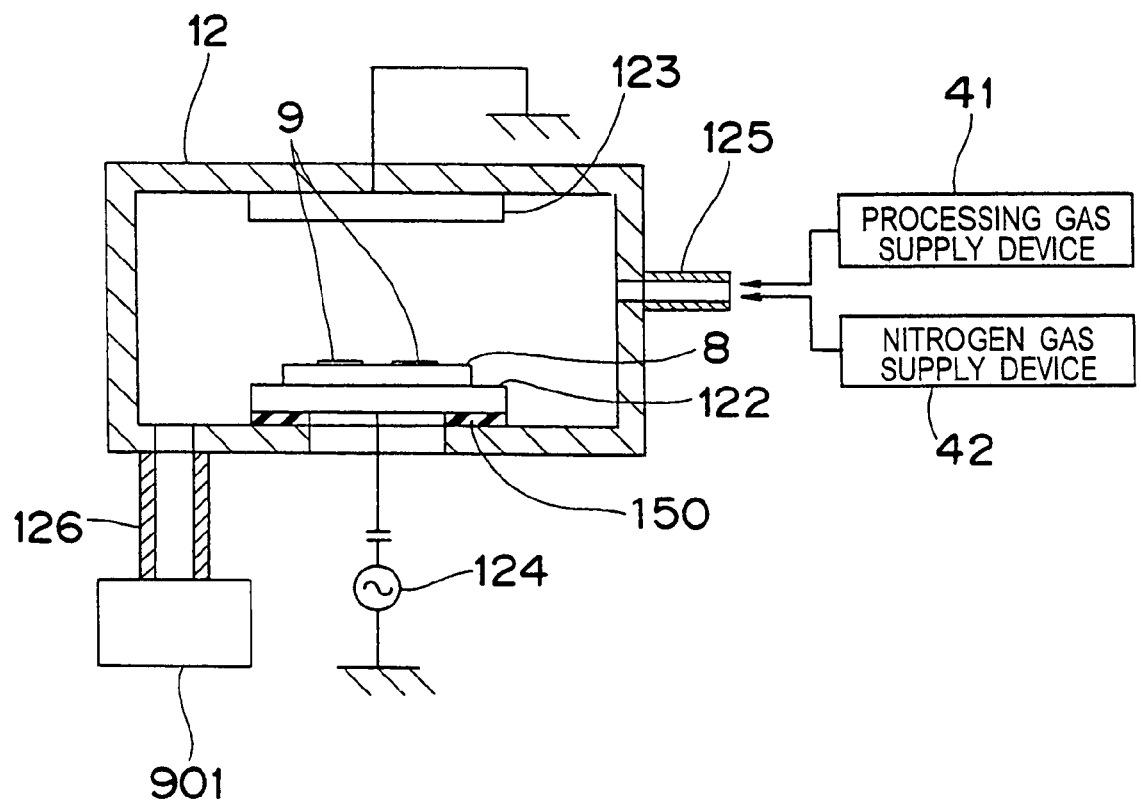
FIG. 3 is a diagram illustrating a configuration of a chamber of the board cleaning apparatus.

FIG. 3 is a diagram illustrating a configuration of the chamber 12. The stage 122 loaded with the pallet 8 functions as an electrode plate, and an electrode plate 123 opposed to the stage 122 is provided at an upper portion in the chamber 12. A high-frequency AC power supply 124 is connected to the stage 122, and thus a plasma generator system that generates plasma in the chamber 12 is composed of the stage 122, the electrode plate 123, and the AC power supply 124.

On the other hand, a gas inlet pipe 125 for introducing gas into the chamber 12, and an exhaust pipe 126 for exhausting gas from inside thereof, are connected to the chamber 12, and the gas inlet pipe 125 is connected to a processing gas supply device 41 that supplies processing gas for a cleaning process for boards 9, and is also connected to a nitrogen gas supply device 42 that supplies nitrogen gas. Gas in the chamber 12 is forcibly exhausted through the exhaust pipe 126 by an exhauster 901 so that a pressure in the chamber 12 can be adjusted.

Figure 4:
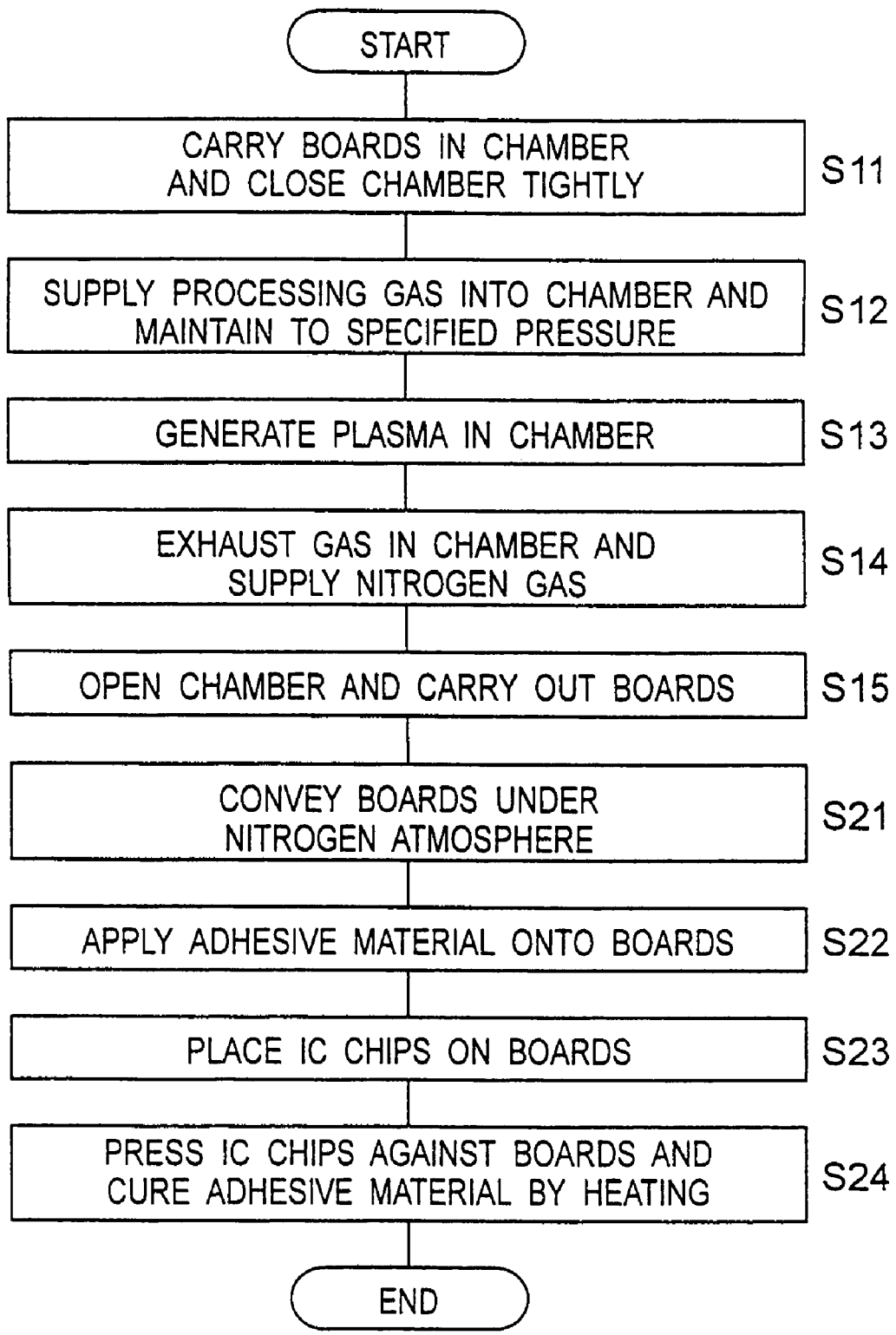
FIG. 4 is a view illustrating operations of the board cleaning apparatus, and steps in which IC chips are placed on boards.

FIG. 4 is a chart illustrating flow of operations of the cleaning apparatus 1 on an occasion when boards 9 are cleaned in the chamber 12, and steps of placement of IC chips onto the boards 9.

After the boards 9 are transferred from a tray 91 onto a pallet 8 in the loader 21 and are conveyed to the cleaning apparatus 1, the transfer robot 13 initially loads onto the stage 122 the boards 9 with the pallet 8, and the gate member 121 closes the inlet-outlet port to tightly close the chamber 12 (step S11). Processing gas is introduced from the processing gas supply device 41 through the gas inlet pipe 125 into the chamber 12 and gas is exhausted through the exhaust pipe 126 so that a pressure in the chamber 12 is reduced to a specified pressure under presence of a specified processing gas (step S12).

After an atmosphere in the chamber 12 is conditioned, a high-frequency voltage is applied between the stage 122 and the electrode plate 123 so that the processing gas is turned into plasma by high-frequency discharge (step S13). With generation of the plasma from the processing gas in the chamber 12, the boards 9 are cleaned by radicals and ions produced in the plasma. As a result, surfaces of the boards 9 are activated, chlorine atoms (that designate chlorine atoms existing in chlorine or in chlorine compound and that will be simply referred to as "chlorine", hereinbelow) deposited on wiring patterns on the boards 9 are removed, and organic matter is removed.

After completion of this cleaning, nitrogen gas is introduced from the nitrogen gas supply device 42 through the gas inlet pipe 125 into the chamber 12 and exhaust through the exhaust pipe 126 is executed so that an atmosphere around the boards 9 is replaced by nitrogen gas atmosphere (step S14). Subsequently, the gate member 121 opens the inlet-outlet port, and the boards 9 with the pallet 8 are carried out by the transfer robot 13 (step S15). With the above procedure, a series of operations for cleaning one pallet 8 are completed.

After that, the boards 9 are conveyed from the cleaning apparatus 1 to the component placing apparatus 22. The boards 9 are conveyed under a nitrogen gas atmosphere (step S21) because the gas supply pipes 15 and 226 for supplying nitrogen gas are connected to the cover 14 of the cleaning apparatus 1 and to the cover 225 of the component placing apparatus 22, and because a conveying path through which the boards 9 are carried out of the chamber 12 is covered with the covers 14 and 225. In accordance with this arrangement, the boards 9 are conveyed to the component placing apparatus 22 without being influenced by activated gas.

Figure 5A:
FIG. 5A, FIG. 5B, and FIG. 5C are diagrams illustrating a manner in which an IC chip is placed on a board.
Figure 5B:
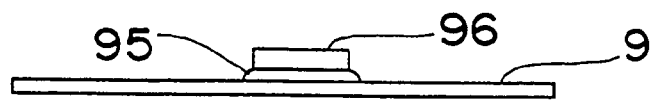
Figure 5C:
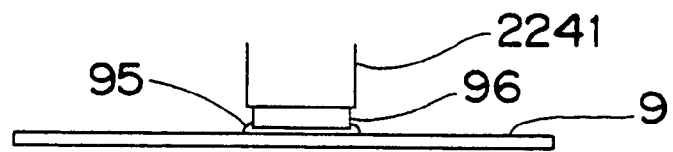

FIG. 5A through FIG. 5C are diagrams illustrating a manner in which an IC chip 96 is placed on a board 9. In the component placing apparatus 22, adhesive material 95 containing conductive minute particles is applied onto a specified area on the board 9 by a nozzle head of the application section 222 (step S22, FIG. 5A), and the IC chip 96 is placed on the adhesive material 95 by the placing section 223 (step S23, FIG. 5B). The heating section 224 has a head 2241 that is heated by a heater, and the head 2241 makes contact with the IC chip 96 and presses the IC chip 96 toward the board 9, and thereby crushes the conductive minute particles contained in the adhesive material 95 to make electric connections between the IC chip 96 and wiring on the board 9. The adhesive material 95 is simultaneously cured by heat from the head 2241 to fix the IC chip 96 on the board 9 (step S24, FIG. 5C).

After completion of placement of the IC chip, the boards 9 are carried out from under a nitrogen atmosphere through the internal air isolation mechanism 33 (shown in FIG. 1) into an air atmosphere, are removed from the pallet 8, and are housed on a tray 92 in the unloader 23.

In the cleaning apparatus 1, specialized processing gas is used for cleaning that is suitable for resin-based boards 9.

Hereinbelow, principles and characteristics of cleaning with use of plasma in the cleaning apparatus 1 will be described.

When boards 9 each having a wiring pattern formed on a resin base are cleaned in the cleaning apparatus 1, one or more gases selected from a group consisting of water vapor ($H_2O$), alcohol vapor, and fluorocarbon gas are used as the processing gas. For more efficient cleaning, oxygen gas ($O_2$) on the order of 10 to 20% is added thereto.

Alcohol refers to a hydroxy compound produced by substitution of OH groups for hydrogen atoms in chain hydrocarbon or alicyclic hydrocarbon. In practice, ethyl alcohol ($C_2H_5OH$), methyl alcohol ($CH_3OH$), or the like is used in consideration of cost.

Fluorocarbonic gas is gas having a molecular structure represented as $C_mF_n$, and there may be used carbon tetrafluoride ($CF_4$), ethylene hexafluoride ($C_2F_6$), propylene octafluoride ($C_3F_8$), and the like. In the following description of the cleaning apparatus 1, carbon tetrafluoride is used as the fluorocarbonic gas.

On condition that water vapor is contained in the processing gas, passage of a current in the chamber 12 causes reactions represented by the following chemical formulae 1. Character "*" in the chemical formulae denotes radicals.

$H_2O \rightarrow OH^* H^+$ $H_2O \rightarrow OH^- + H^+$      Chemical formulae 1

On condition that alcohol vapor is contained in the processing gas, reactions represented by chemical formulae 2 are caused and reactions represented by chemical formulae 3 are caused in oxygen gas contained in the processing gas. Character "R" in chemical formulae 2 represents a hydrocarbon group (a broadly-defined alkyl group). Collision of an electron ($e^-$) with an oxygen radical ($O^*$) forms an oxygen ion ($O^-$)

$R-OH \rightarrow R-O^* + H^*$ $R-OH \rightarrow R-O^- + H^+$      Chemical formulae 2

$O_2 \rightarrow O^* + O^*$ $O_2 + 2e^- \rightarrow O^- + O^-$      Chemical formulae 3

On condition that fluorocarbonic gas is contained in the processing gas, reactions represented by chemical formulae 4 are caused in the chamber 12.

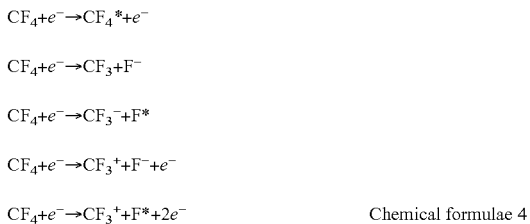

Chemical formulae 4

The reactions represented by chemical formulae 4 cause reactions represented by chemical formulae 5.

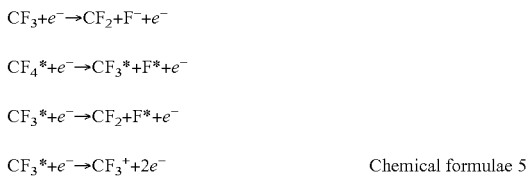

Chemical formulae 5

Subsequently, decomposition following that represented by chemical formulae 5 proceeds and produces fluorine ions such as $F^+$ and $F^-$.

A pressure in the chamber 12 is reduced for facilitating generation of plasma and is preferably set between 5 and 80 Pa in terms of the generation of plasma. In terms of further appropriate generation of radicals and ions, the pressure in the chamber 12 is more preferably set between 20 and 40 Pa.

In the chamber 12, radicals and ions generated as plasma achieve three functions with respect to boards 9, i.e., removal of organic matter, activation of board surfaces, and removal of chlorine.

Figure 6:
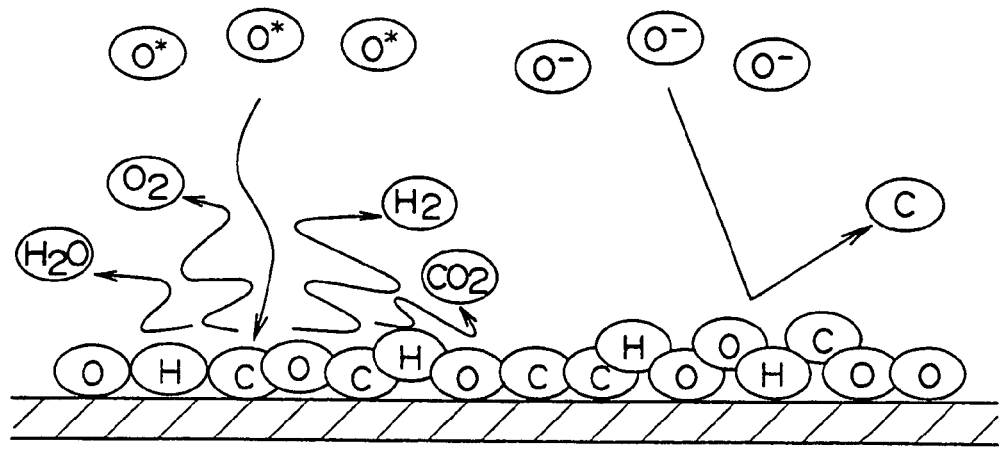
FIG. 6 is a diagram illustrating a manner in which organic matter on the board is removed by oxygen radicals and various kinds of ions.

FIG. 6 is a diagram illustrating a manner in which organic matter on a board 9 is removed by oxygen radicals and various kinds of ions. On left side of FIG. 6 is illustrated a manner in which the organic matter on the board 9 is decomposed into oxygen, hydrogen, water, carbon dioxide, carbon monoxide, and the like by oxygen radicals and is gasified and then removed. On right side of FIG. 6 is illustrated a manner in which the organic matter is removed by a sputtering action of ions colliding with the organic matter. Though FIG. 6 illustrates only oxygen ions as an example, other ions contribute to removal of the organic matter. The organic matter is thus removed by chemical reactions and physical reactions in the chamber 12, and addition of oxygen gas to the processing gas makes possible more efficient removal of the organic matter with use of oxygen radicals.

On the other hand, a surface of the board 9 is activated by oxygen radicals, hydrogen radicals, and the like that are generated in the chamber 12. That is, the surface of the board 9 that is of polyimide resin, as an example of resin-based board 9, reacts with oxygen radicals, hydrogen radicals, and the like, so that polar groups such as carboxyl groups (—COOH), carbonyl groups (>C=O), hydroxyl groups (—OH), amide groups (—CONH$_2$), and amino groups (—NH$_2$) are formed on the surface of the board 9. As a result, strong adhesion of IC chips onto the board 9 through medium of the adhesive material is achieved in a post-processing.

Figure 7:
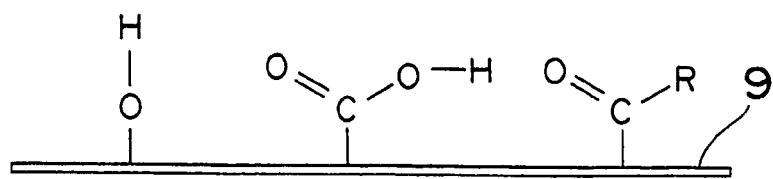
FIG. 7 is a diagram illustrating a surface of a board that has been activated.
Figure 8:
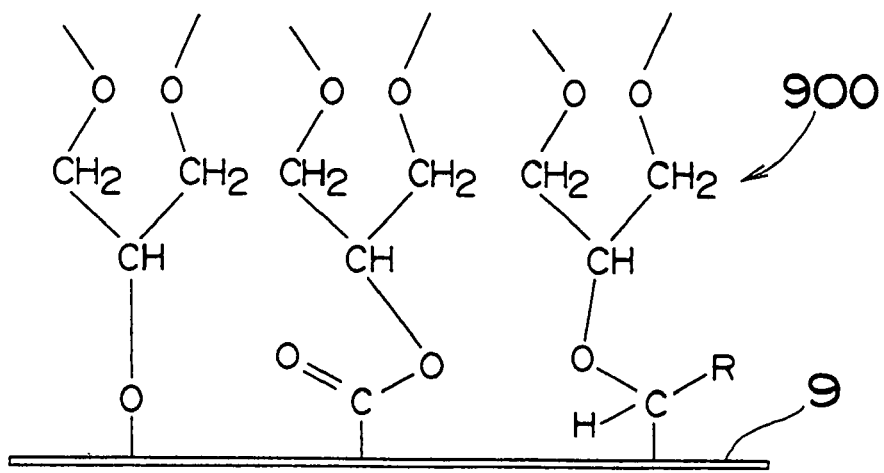
FIG. 8 is a diagram illustrating a bond between the board and a resin layer.

FIG. 7 is a diagram schematically illustrating a state in which a surface of a board 9 has been activated by formation thereon of hydroxyl groups, carboxyl groups, and carbonyl groups. As shown in FIG. 8, formation of these polar groups on the surface of the board 9 results in strong chemical bond between the board 9 and a resin layer 900 of epoxy that is a main component of the adhesive material.

Figure 9:
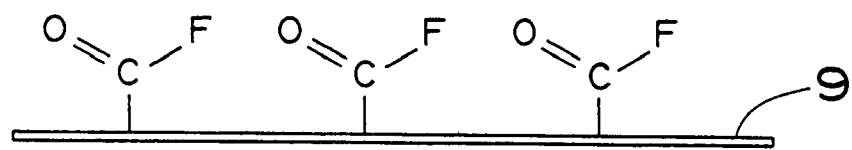
FIG. 9 is a diagram illustrating a surface of a board that has been activated.
Figure 10:
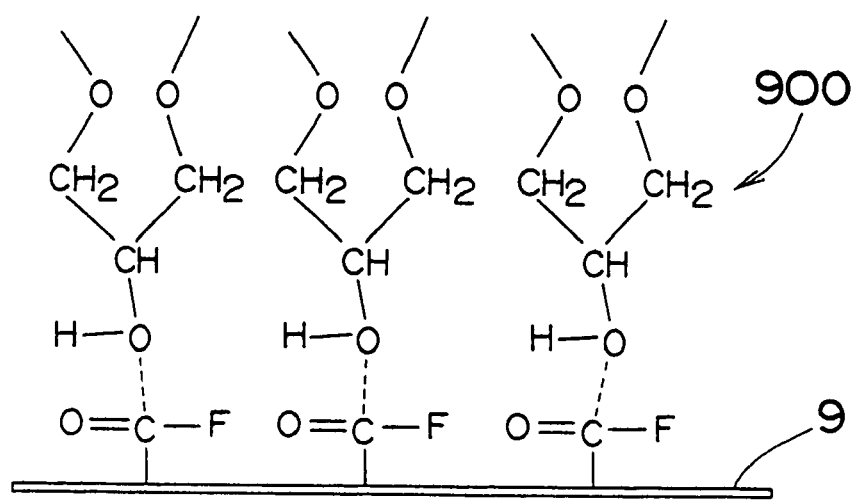
FIG. 10 is a diagram illustrating a bond between the board of FIG. 9 and a resin layer.

Activation of a surface of a board 9 is achieved also on condition that carbon tetrafluoride ($CF_4$) is contained in the processing gas. FIG. 9 is a diagram illustrating a state in which COF groups (—COF) have been formed on the surface of the board 9 by fluorine radicals and fluorine ions produced from carbon tetrafluoride, and in which the surface has been activated consequently. Fluorine atoms have a high electronegativity and have a property of attracting electrons, and a carbon atom in a COF group therefore becomes $\delta^+$ electrically. As a result, oxygen atoms each having become $\delta^-$ electrically in hydroxyl groups of a resin layer 900, shown in FIG. 10, and carbon atoms on the board 9 are attracted to each other, and strong bond between the surface of the board 9 and the resin layer 900 is achieved.

By action of hydrogen ions and fluorine ions, generated in the chamber 12, furthermore, chlorine that is contained in chlorinated solvent used in a plating process or the like in manufacture of board 9, and that remains on a surface of the board 9, turns into hydrogen chloride (HCl), chlorine fluoride (ClF), chlorine trifluoride ($ClF_3$), and the like. Removal of chlorine from the board 9, as gaseous compounds, is thus achieved because chlorine fluoride is gaseous in decompressed chamber 12 and because hydrogen chloride, chlorine trifluoride, and the like are gaseous at ordinary temperatures under normal pressure.

In the cleaning apparatus 1, as described above, removal of organic matter, activation of surfaces, and removal of chlorine from boards 9 are achieved by use of one or more gases selected from the group consisting of water vapor ($H_2O$), alcohol vapor, and fluorocarbon gas, as a processing gas. The removal of organic matter is performed more efficiently by addition of oxygen gas to the processing gas.

The activation of the surface leads to strong adhesion of IC chips onto the board 9 during placement of IC chips in post-processing, and the removal of chlorine prevents ionic migration from occurring in wiring on the board 9. As a result, cleaning that is particularly suitable for the resin-based boards 9 is performed in the cleaning apparatus 1, so that reliability of placement of IC chips on the boards 9 can be improved.

In particular, prevention of ionic migration (i.e., the removal of chlorine) is important when electronic components, such as IC chips, having fine electrodes are placed directly on boards 9. Deterioration in reliability of circuits on a board 9 that is caused by ionic migration is noticeable on condition that gaps between wiring lines in a wiring pattern are larger than 0 µm and not larger than 25 µm, and therefore, cleaning by the cleaning apparatus 1 is extremely effective for boards having as connection sites such fine wiring.

Though the embodiment of the present invention has been described above, the present invention is not limited to the above embodiment but various changes may be made.

In the embodiment, generation of plasma is promoted by reduction in pressure in the chamber 12; however, mixture of helium (He) with a processing gas may permit a degree of pressure reduction in the chamber 12 to be lessened.

A technique for generating plasma is not limited to such a technique using parallel plate electrodes as in the embodiment, and plasma may be generated by other techniques.

In the embodiment, adhesive material containing conductive minute particles is used and the conductive minute particles are crushed between IC chips and wiring on a board 9 to thereby make electric connections between the IC chips and the wiring; however, adhesive material containing no conductive minute particles may be used. For example, bumps may be formed on IC chips, and electrodes having copper, nickel, and gold laminated sequentially from a resin body side may be formed on a board 9, so that the IC chips may be fixed onto the board 9 by adhesive material, with compressed connection between the bumps and the electrodes.

The adhesive material is not required to be applied as a coating of fluid onto boards 9, but film-like adhesive material may be used. For such film-like adhesive material, the material is cut into films with specified lengths and the films are pasted on placement positions for IC chips.

Figure 11:
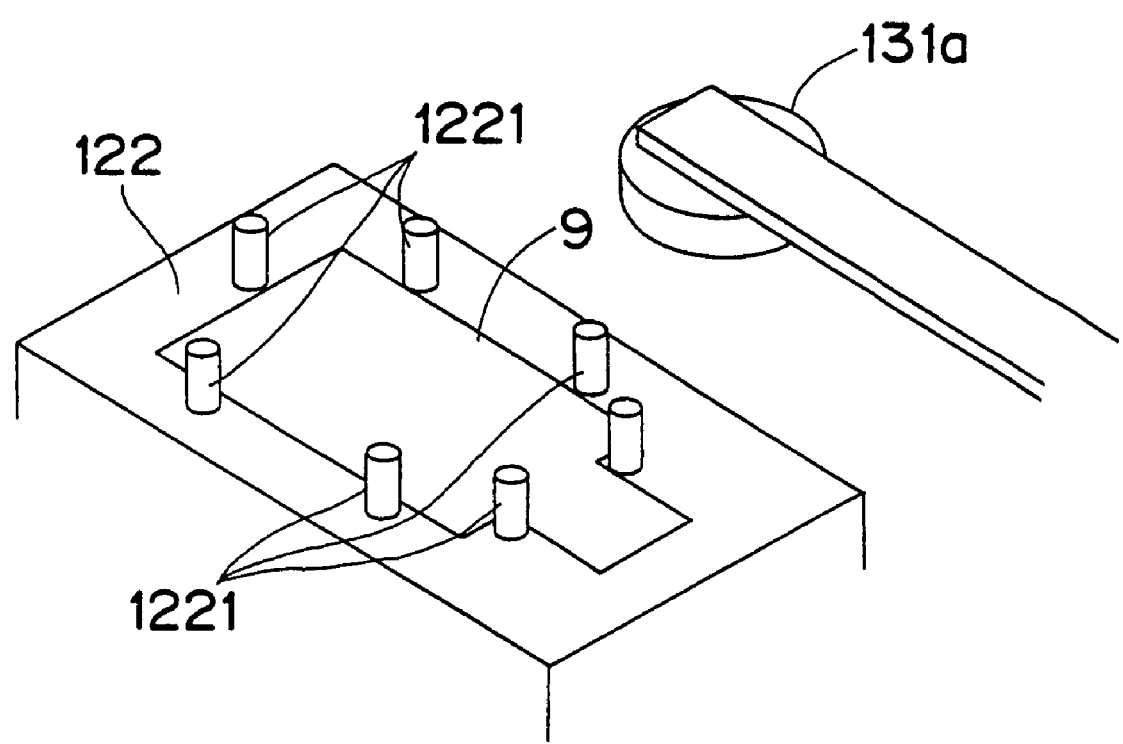
FIG. 11 is a diagram illustrating a state in which a board has been loaded onto a stage.

Though boards 9 are cleaned while being held on a pallet 8 in the embodiment, the boards 9 may be removed from the pallet 8 and then may be cleaned. In order that a position of a board 9 may not be shifted with pressure reduction in the chamber 12, the board 9 is preferably fixed by pins 1221 or the like on the stage 122 as shown in FIG. 11 as an example. The pins 1221 are preferably formed of insulating material such as alumina, and the board 9 is loaded on the stage 122 by a suction chuck(s) 131a of the transfer robot 13 or the like.

The boards 9 in the above embodiment are described as formed of polyimide resin, yet the boards 9 may be formed of epoxy resin. Provided that adhesive material is an epoxy-based one in this case, placement of IC chips involves connection between the epoxy resin and the epoxy-based adhesive material. Surface activity and a principle of connection in this case are similar to those described with use of FIG. 7 through FIG. 10. The boards 9 may be boards that lack flexibility.

In the embodiment is described an example in which chlorine is removed for prevention of ionic migration; however, use of the board cleaning method of the present invention even in presence of other ions (such as $Br^-$, $SO^{2-}_4$, and $NH^+_4$) associated with migration may improve adherence during connection, may prevent intrusion of moisture, and may consequently prevent ionic migration.

Cleaning of resin-based boards with use of specified processing gas is not limited to that for connection between boards and electronic components such as IC chips, but may be performed as cleaning of connection sites on boards in various applications.

For example, the dry cleaning in the embodiment may be performed for connection between resin and resin in manufacture of multilayer boards. In manufacture of multilayer boards with use of polyimide resin, polyimide boards are cleaned with use of gas containing carbon tetrafluoride ($CF_4$) as processing gas, polyimide-based varnish is thereafter applied onto the boards, and adhesion and curing are executed at about 350 degrees centigrade. In this case, COF groups are formed on the boards, as shown in FIG. 9, by the dry cleaning with use of the processing gas, and strong connection between the boards is achieved by interaction between amide groups of polyimide-based resin layers and the COF groups.

Cleaning of boards may be done locally for connection sites on the boards. That is, the processing gas may be supplied only to a neighborhood of the connection sites on the boards, and the cleaning of the connection sites may be performed by plasma generated in the processing gas. In this manner, the dry cleaning may be performed at least for the connection sites on the boards, so that improvement in reliability of connection may be achieved.

Reactions and scientific bonds on occasion of adhesion that have been described in accordance with the embodiment have been described to a generally surmisable extent, and more complex reactions and other kinds of chemical or physical bonds may occur as real reactions and bonds.

In accordance with the present invention, reliability of connection with resin-based boards can be improved. In particular, reliability in placement of electronic components onto boards having fine wiring formed thereon can be improved by activation of surfaces of the boards and the removal of chlorine.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An apparatus comprising:
    a chamber into which a resin-based board having a connection site is to be supplied;
    a gas introduction device for supplying, into said chamber, oxygen gas and a gas containing at least one of water vapor and alcohol vapor;
    a board cleaning apparatus having a plasma generator system for generating plasma in said chamber so as to dry-clean the connection site of the board, said board cleaning apparatus having a cover;
    a placing apparatus for placing an IC chip on the board, said placing apparatus having a cover;
    a conveyor for transferring the board between said board cleaning apparatus and said placing apparatus while exposing the connection site to a nitrogen gas atmosphere;
    a loader for loading the board onto said conveyor;
    an unloader for unloading the board from said conveyor;
    a duct for making a connection between said cover of said board cleaning apparatus and said cover of said placing apparatus; and
    internal air isolation mechanisms for utilizing a nitrogen gas flow, said internal air isolation mechanisms being provided between said loader and said board cleaning apparatus and between said placing apparatus and said unloader so as to provide the nitrogen atmosphere inside said cover of said board cleaning apparatus and said cover of said placing apparatus.

2. The apparatus according to claim 1, wherein said board cleaning apparatus includes a transfer robot for transferring the board from said conveyor into said chamber.

3. The apparatus according to claim 2, wherein said placing apparatus comprises:
    an application section for applying adhesive material on the board;
    a placing section for placing the IC chip on the applied adhesive material; and
    a heating section for pressing the IC chip against the board while applying heat.

4. The apparatus according to claim 1, wherein said placing apparatus comprises:
    an application section for applying adhesive material on the board;
    a placing section for placing the IC chip on the applied adhesive material; and
    a heating section for pressing the IC chip against the board while applying heat.

* * * * *

UNITED STATES PATENT AND TRADEMARK OFFICE
CERTIFICATE OF CORRECTION

PATENT NO.       : 7,635,016 B2                                              Page 1 of 1
APPLICATION NO. : 10/265381
DATED            : December 22, 2009
INVENTOR(S)      : Suzuki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 811 days.

Signed and Sealed this

Ninth Day of November, 2010

David J. Kappos
*Director of the United States Patent and Trademark Office*